United States Patent
Sharma et al.

(10) Patent No.: US 9,152,753 B1
(45) Date of Patent: Oct. 6, 2015

(54) INCREMENTER ABSORPTION INTO MULTIPLIER LOGIC FOR PROGRAMMABLE LOGIC DEVICES

(71) Applicant: Lattice Semiconductor Corporation, Hillsboro, OR (US)

(72) Inventors: Sunil Kumar Sharma, Fremont, CA (US); Amit Singh, San Jose, CA (US)

(73) Assignee: Lattice Semiconductor Corporation, Portland, OR (US)

( * ) Notice: Subject to any disclaimer, the term of this patent is extended or adjusted under 35 U.S.C. 154(b) by 0 days.

(21) Appl. No.: 14/319,481

(22) Filed: Jun. 30, 2014

(51) Int. Cl.
*G06F 17/50* (2006.01)

(52) U.S. Cl.
CPC .......... *G06F 17/5054* (2013.01); *G06F 17/505* (2013.01)

(58) Field of Classification Search
CPC .................................................. G06F 17/5054
USPC ................................................. 716/116, 117
See application file for complete search history.

(56) References Cited

U.S. PATENT DOCUMENTS

| | | | |
|---|---|---|---|
| 6,505,337 B1* | 1/2003 | Wittig et al. | 716/117 |
| 7,404,155 B1* | 7/2008 | Nancekievill et al. | 326/41 |
| 7,506,278 B1* | 3/2009 | Rjimati et al. | 716/104 |
| 7,506,298 B1* | 3/2009 | Ingoldby et al. | 716/104 |
| 7,523,421 B1* | 4/2009 | Nancekievill et al. | 716/132 |
| 7,627,458 B1* | 12/2009 | Van Mau et al. | 703/2 |
| 7,634,753 B2* | 12/2009 | Reynolds | 716/128 |
| 2008/0148214 A1* | 6/2008 | Yancey et al. | 716/18 |

* cited by examiner

*Primary Examiner* — Suresh Memula

(57) ABSTRACT

Various techniques are provided to efficiently implement user designs in programmable logic devices (PLDs). In one example, a computer-implemented method includes receiving a design identifying operations to be performed by a PLD. The computer-implemented method also includes synthesizing the design into a plurality of PLD components. In the computer-implemented method, the synthesizing includes detecting an incrementer-multiplier operation in the design and merging an incrementer portion of the incrementer-multiplier operation with a multiplier portion of the incrementer-multiplier operation to reduce the plurality of PLD components.

20 Claims, 8 Drawing Sheets

INCREMENTER ABSORPTION INTO MULTIPLIER LOGIC FOR PROGRAMMABLE LOGIC DEVICES

TECHNICAL FIELD

The present invention relates generally to programmable logic devices and, more particularly, to the synthesis of user designs implemented in such devices.

BACKGROUND

Programmable logic devices (PLDs) (e.g., field programmable gate arrays (FPGAs), complex programmable logic devices (CPLDs), field programmable systems on a chip (FPSCs), or other types of programmable devices) may be configured with various user designs to implement desired functionality. Typically, the user designs are synthesized and mapped into configurable resources (e.g., programmable logic gates, look-up tables (LUTs), embedded hardware, or other types of resources) and interconnections available in particular PLDs. Physical placement and routing for the synthesized and mapped user designs may then be determined to generate configuration data for the particular PLDs.

User designs sometimes include one or more arithmetic operations where a first input is incremented and then multiplied by a second input. Conventional methods for synthesizing and/or mapping such incrementer-multiplier operations into configurable resources in a PLD can lead to a relatively large propagation delay, particularly for large numerical inputs, which in turn results in an increased clock period and reduced clock frequency for the PLD. Moreover, such conventional methods may also inefficiently allocate configurable resources and interconnections.

BRIEF DESCRIPTION OF THE DRAWINGS

Embodiments of the present disclosure and their advantages are best understood by referring to the detailed description that follows. It should be appreciated that like reference numerals are used to identify like elements illustrated in one or more of the figures.

DETAILED DESCRIPTION

In accordance with embodiments set forth herein, techniques are provided to efficiently implement user designs in programmable logic devices (PLDs), particularly where dedicated PLD resources, such as dedicated multiplier hardware implementations, are not present or not available for use. Embodiments of the present disclosure provide a methodology to merge the arithmetic operations of an incrementer-multiplier operation to predictably increase overall PLD performance.

In various embodiments, a user design may be converted into and/or represented by a set of PLD components (e.g., configured for logic, arithmetic, or other hardware functions) and their associated interconnections available in a PLD. In various embodiments, an incrementer-multiplier operation synthesis and/or mapping process (e.g., also referred to as an optimization process or an absorption process) may be performed on the user design to reduce propagation delays and/ or consumption of PLD resources and interconnections. In some embodiments, the various techniques described herein may be applied to PLDs in the iCE40 family devices available from Lattice Semiconductor Corporation, or other devices as appropriate.

In some embodiments, such a process includes identifying one or more incrementer-multiplier operations within a user design which, when a PLD is configured to implement the user design, could be implemented relatively efficiently using the methods described herein. To explain, a incrementer-multiplier operation may be represented generically by the relation $(A+1)*B=P$, where A is the first variable input or "incrementer operand" of the operation, B is the second variable input or "multiplier operand" of the operation, $(A+1)$ is the "multiplicant operand" and corresponds to an incrementer portion of the operation, and P is the output of the operation (e.g., the product of $(A+1)$ and B). In some embodiments, a PLD may not include dedicated multiplier blocks that can be assigned to a incrementer-multiplier operation, or a user design may include more multiplier operations than available dedicated multiplier blocks, and so at least one incrementer-multiplier operation will be decomposed into constituent operations (e.g., one or more addition, shift, and/or other logic or arithmetic operations) that can be implemented using available resources of the PLD. In such embodiments, the process described herein may include decomposing the incrementer-multiplier operation into various constituent operations and merging the incrementer and the multiplier portions of the decomposed incrementer-multiplier operation into a relatively efficient parallelized implementation.

Figure 1:
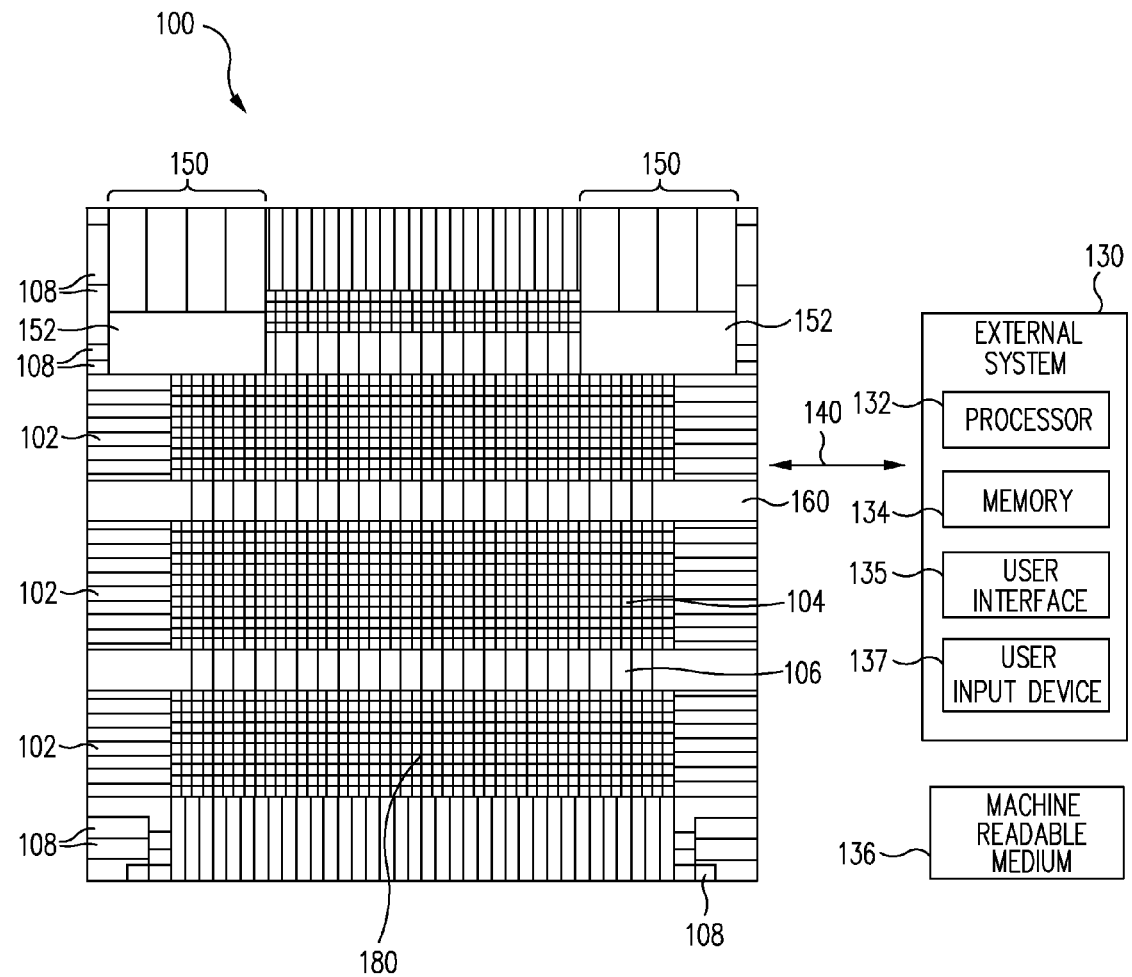
FIG. 1 illustrates a block diagram of a programmable logic device (PLD) in accordance with an embodiment of the disclosure.
Figure 2:
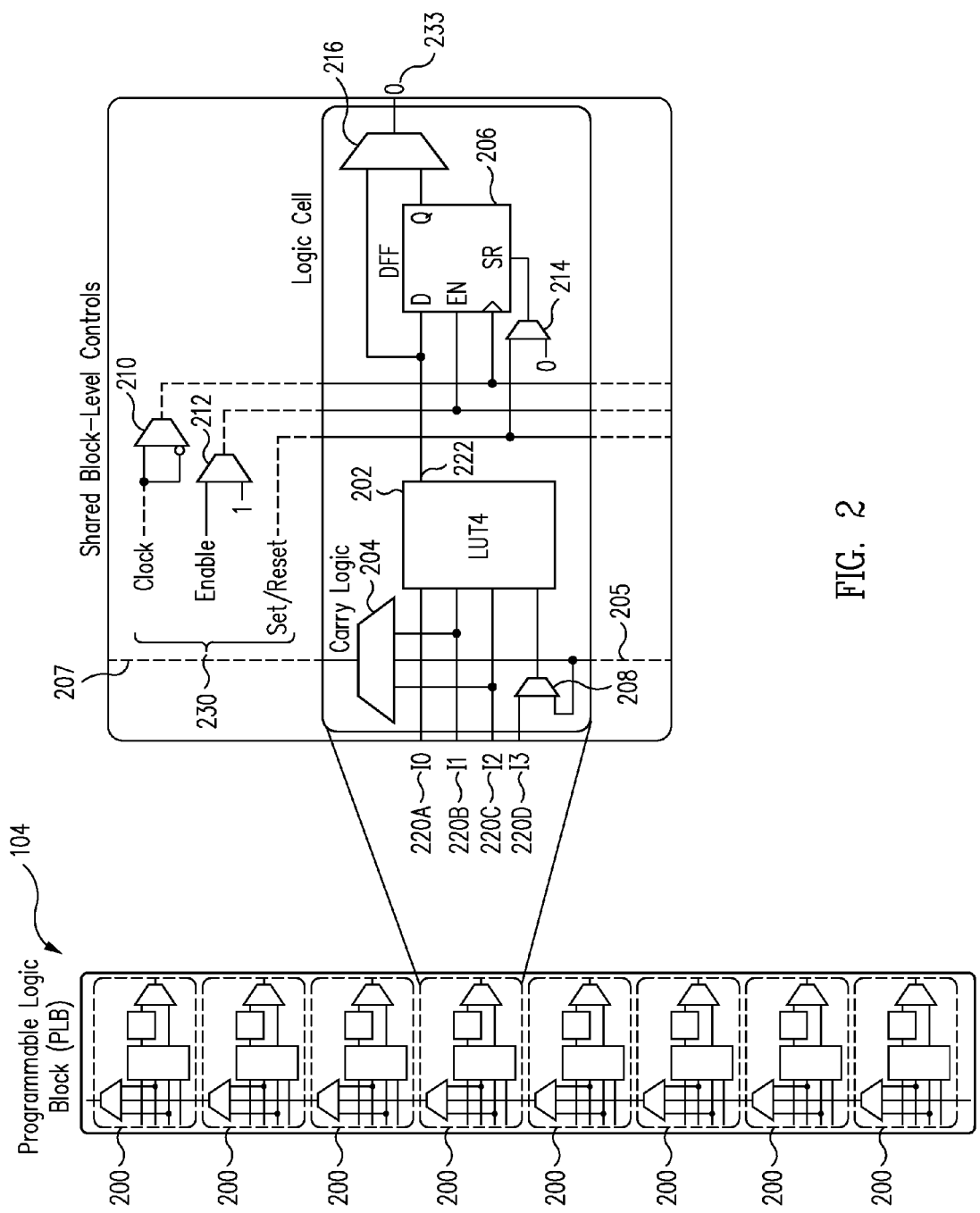
FIG. 2 illustrates a block diagram of a logic block for a PLD in accordance with an embodiment of the disclosure.
Figure 3:
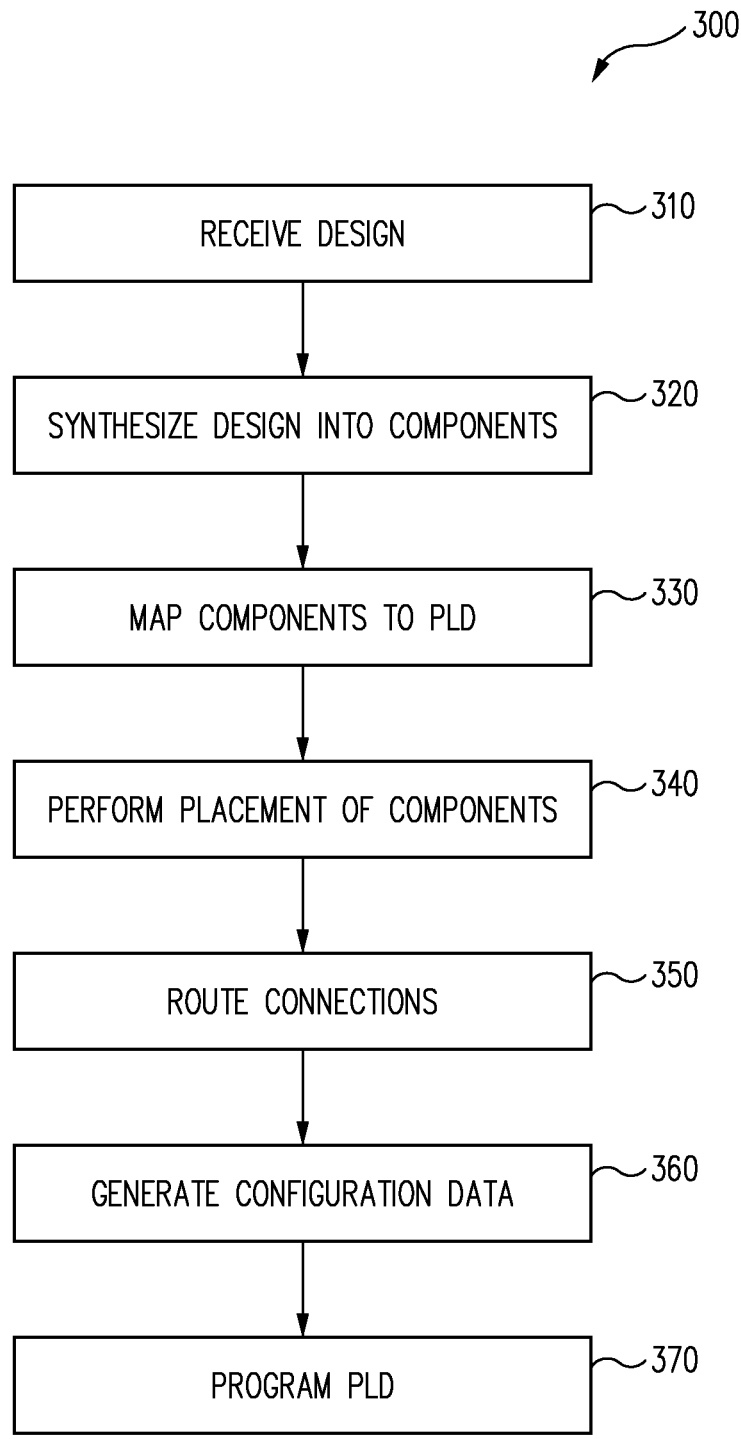
FIG. 3 illustrates a design process for a PLD in accordance with an embodiment of the disclosure.
Figure 5:
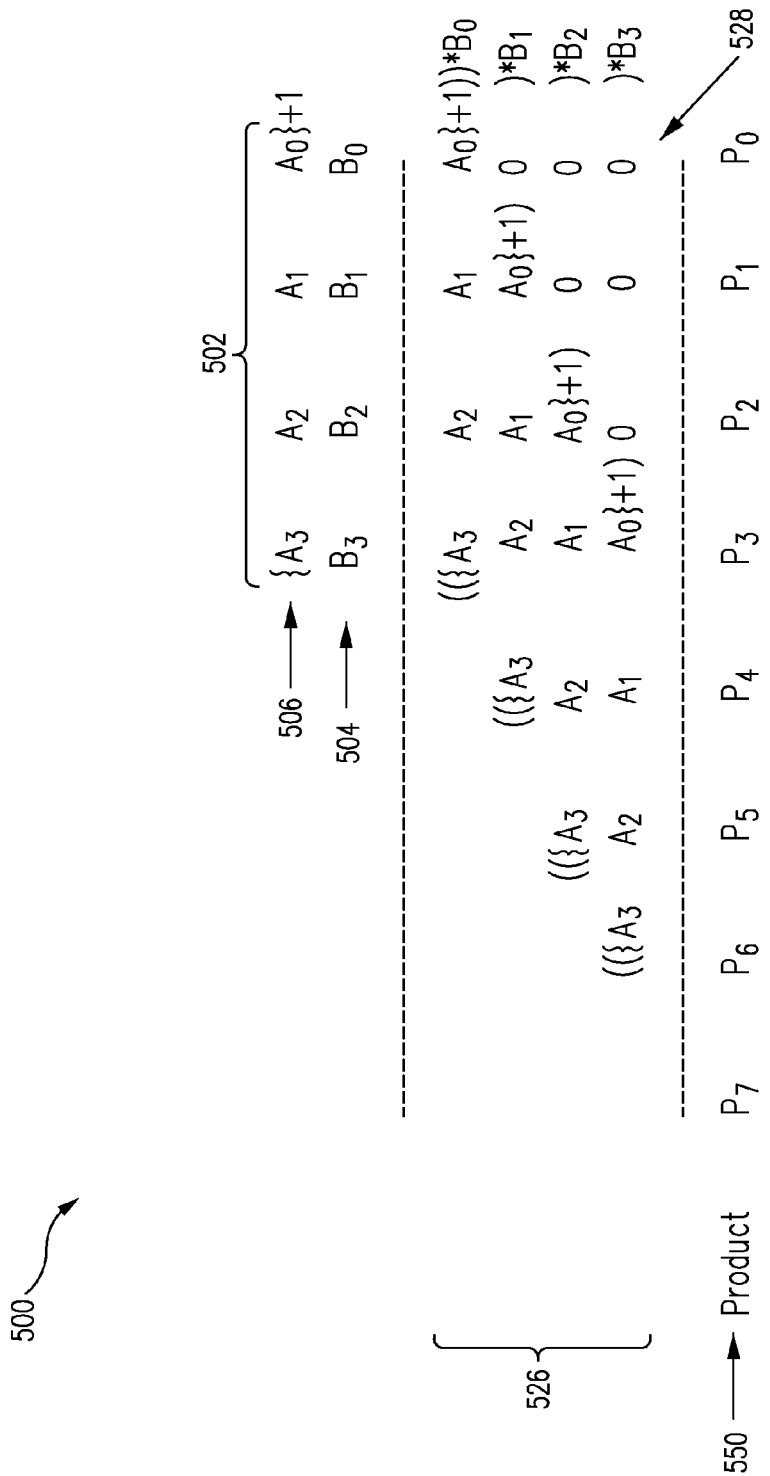
FIG. 5 illustrates a mathematical graph corresponding to a first incrementer-multiplier operation, in accordance with an embodiment of the disclosure.
Figure 6:
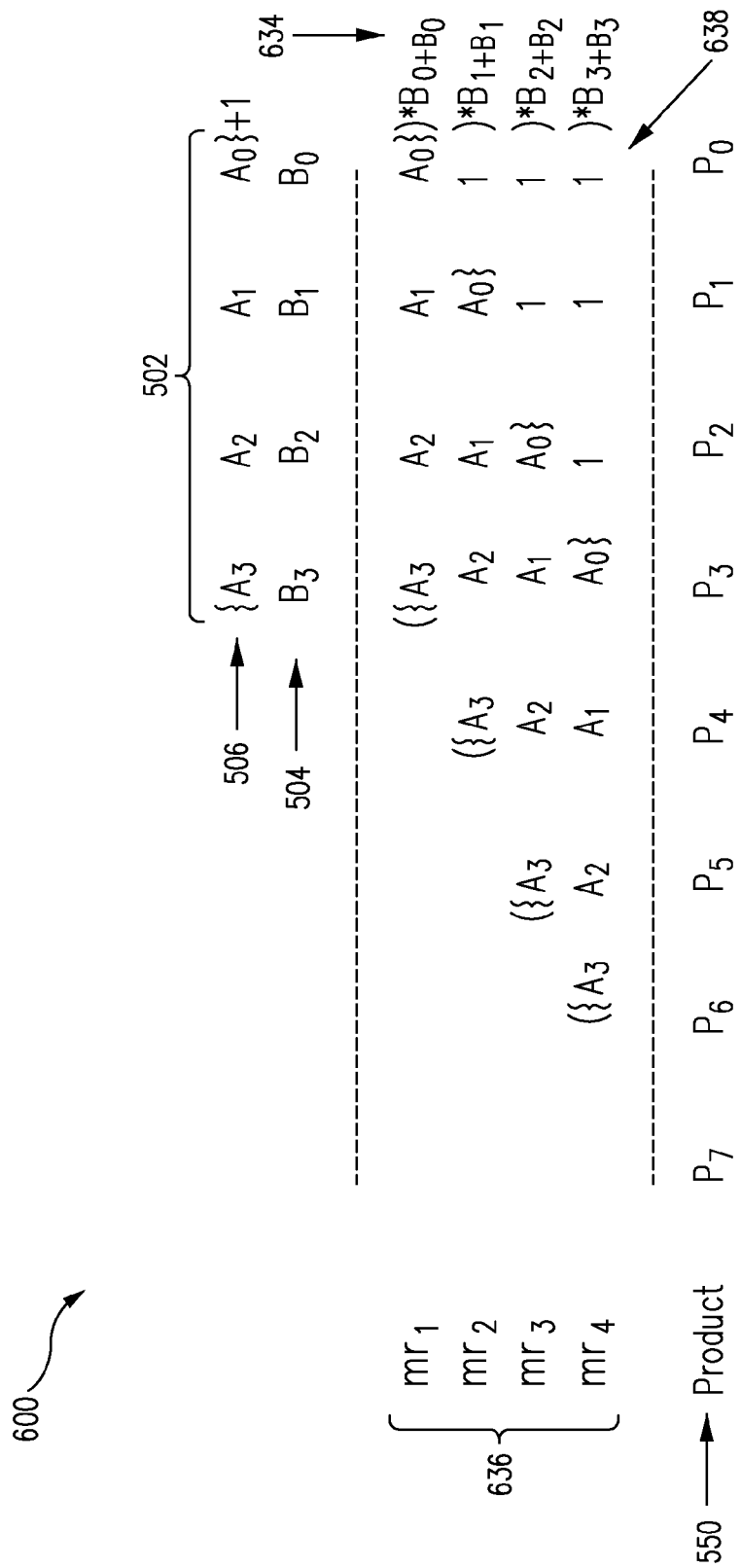
FIG. 6 illustrates a mathematical graph corresponding to a second incrementer-multiplier operation, in accordance with an embodiment of the disclosure.
Figure 7:
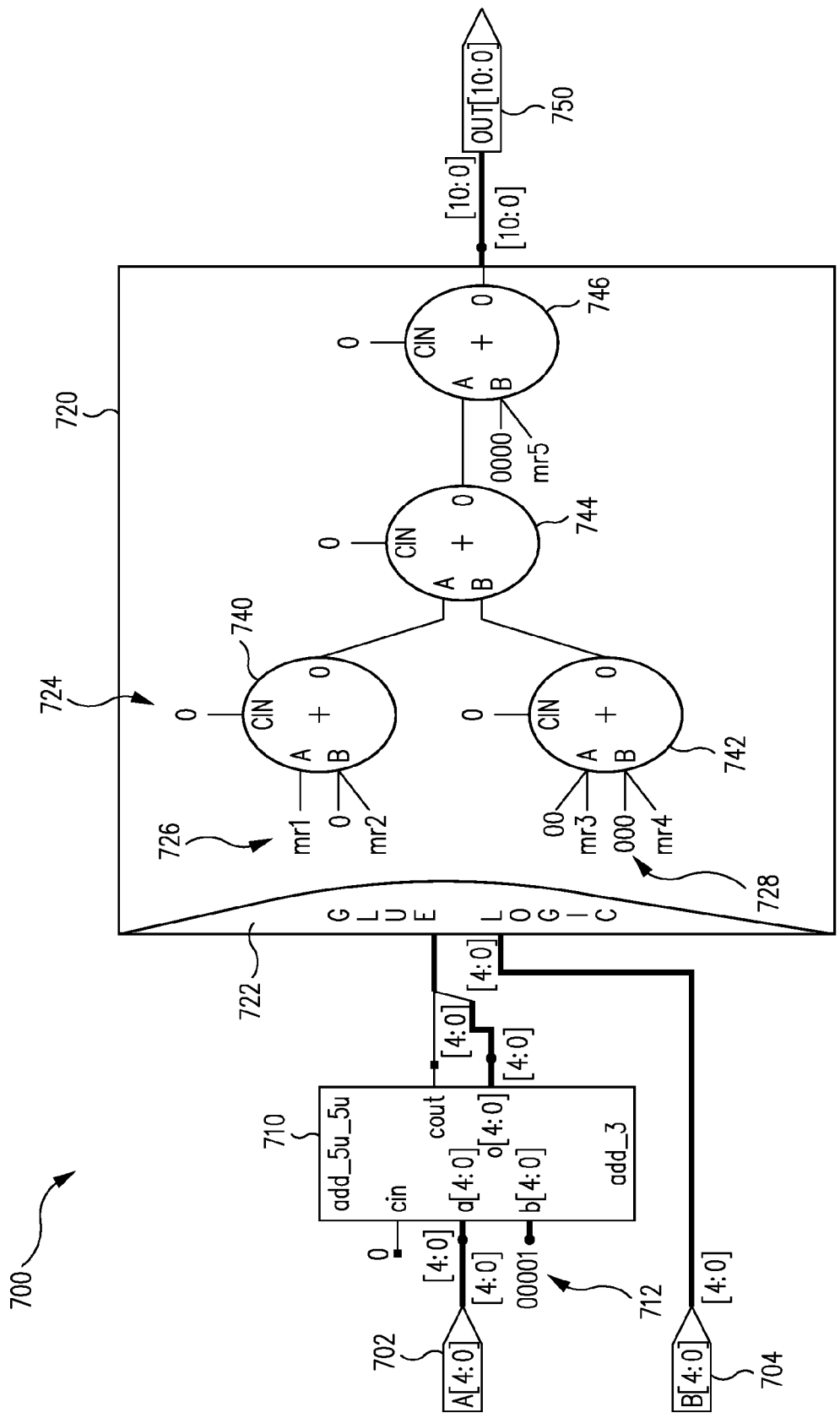
FIG. 7 illustrates a first incrementer-multiplier operation implementation, in accordance with an embodiment of the disclosure.
Figure 8:
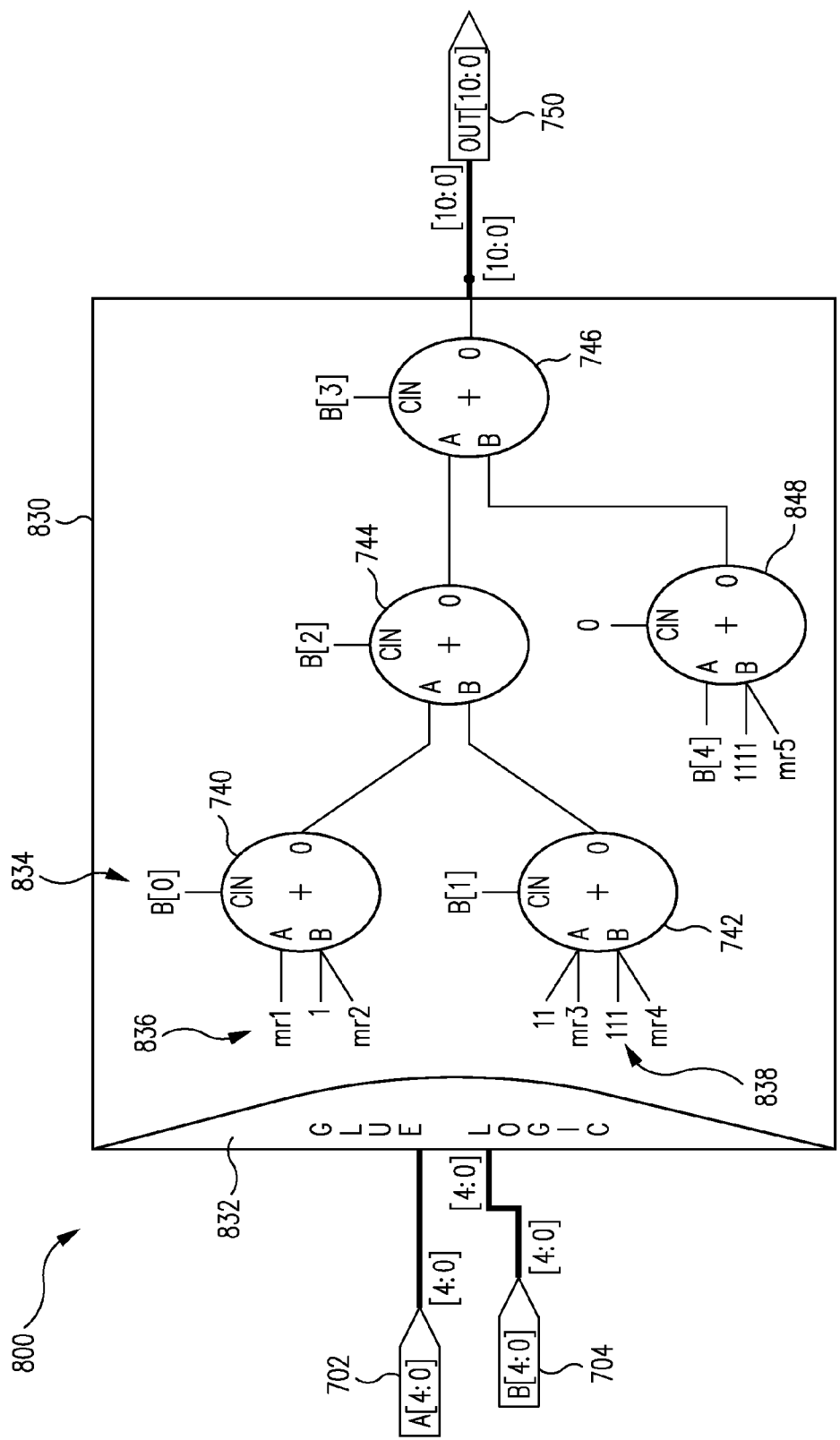
FIG. 8 illustrates a second incrementer-multiplier operation implementation, in accordance with an embodiment of the disclosure.

The embodiments disclosed herein may be further understood with reference to implementation and configuration techniques of PLDs. For example, FIGS. 1 and 2 illustrate a PLD 100 and constituent programmable logic blocks 104 and logic cells 200, along with a system 130 that may be used to configure PLD 100 according to the optimization processes described herein. FIG. 3 illustrates a process 300, which may be performed by configuration system similar to system 130, that can be adapted to implement the optimization processes described herein, such as embodiments of optimization process 400 of FIG. 4. FIGS. 5 and 6 illustrate conceptual arithmetic operations embedded within two different incrementer-multiplier operation implementations. FIGS. 7 and 8 illustrate implementations of incrementer-multiplier operations that can be provided within PLD 100 (e.g., as appropriately configured) using one or more of programmable logic blocks 104 and logic cells 200 of FIG. 1.

Referring now to FIG. 5, a mathematical graph 500 is shown corresponding to an incrementer-multiplier operation, in accordance with an embodiment of the disclosure. In FIG. 5, incrementer input 502 (e.g., conceptually the "A" of $(A+1)*B=P$) is incremented to produce multiplicant operand 506

(e.g., the "(A+1)"), and then multiplicant operand 506 (e.g., the "B") is multiplied by multiplier operand 504 to produce product 550 (e.g., the "P"). One method of determining product 550 is to first decompose the operation into multiple partial products 526, as shown in graph 550. Each partial product may be generated by shifting multiplicant operand 506 to the left using null paddings 528 (e.g., using one or more shift and/or padding operations), as shown, and then multiplying the shifted multiplicant operand 506 by the appropriate element or digit of multiplier operand 504. Product 550 may then be calculated by summing partial products 526 (e.g., using one or more addition operations). Mathematical graph 500 is generally accurate for any arithmetic base (e.g., ternary, quaternary, octal, decimal, hexadecimal, and/or other arithmetic base).

FIG. 6 illustrates a mathematical graph 600 corresponding to a relatively efficient incrementer-multiplier operation, in accordance with an embodiment of the disclosure. In particular, in the context of binary arithmetic, mathematical graph 600 produces the same product 550 given the same incrementer input 502 and multiplier operand 504. Specifically, mathematical graph 600 illustrates extracting the incrementer operation within multiplicant operand 506 and merging or embedding the incrementer operation within partial products 636. For example, as shown in FIG. 6, the incrementer-multiplier operation is decomposed into multiple partial products 636 (e.g., also referenced individually as mr1, mr2, mr3, and mr4), and each partial product may be generated by shifting incrementer input 502 to the left using unit paddings 638 (e.g., using one or more shift and/or padding operations), as shown, multiplying the shifted incrementer input 502 by the appropriate element or digit of multiplier operand 504, and then adding the appropriate carry-in value (e.g., also an appropriate element or digit of multiplier operand 504) of carry-in values 634. Product 550 may then be calculated by summing partial products 636 (e.g., using one or more addition operations).

Because the incrementer operation is merged or embedded within partial products 636 (e.g., using carry-in values 634) outside the multiplication operations performed on incrementer input 502 ("A"), addition operations corresponding to the decomposition of the incrementer portion of the incrementer-multiplier operation may be performed substantially in parallel with addition operations corresponding to the decomposition of the multiplier portion of the incrementer-multiplier operation, in order to form partial products 636. Furthermore, the techniques used to merge or embed the incrementer operation within partial products 636 may be configured to minimize the PLD resources necessary to implement the resulting decomposition into various addition, shift, padding, and/or other arithmetic and/or logic operations, as described herein. Thus, the incrementer and multiplier portions of the incrementer-multiplier operation may be merged as shown in FIG. 6 to generate an efficient implementation of the incrementer-multiplier operation. While mathematical graph 600 is accurate primarily for binary arithmetic, similar graphs may be developed for other arithmetic bases and be implemented in a PLD.

Both graphs 500 and 600 illustrate operations to produce the same product 550, but the operations illustrated in graph 600 require fewer PLD resources and a shorter propagation delay due to the methodology used to merge the incrementer and multiplier portions of the incrementer-multiplier operation. Thus, a generally applicable method to merge the incrementer and multiplier portions of an incrementer-multiplier operation, as described herein, offers substantial benefit in terms of resulting PLD resource (area and time delay) allocation, particularly for incrementer-multiplier operations with relatively large bit-width inputs or operands.

In one embodiment, such a method may include determining whether a multiplier operand of the incrementer-multiplier operation has a bit-width that is a power of two (e.g., where the bit-width of the multiplier operand is equal to $2^n$, where n is a whole number). In cases where the multiplier operand bit-width is a power of two, addition operations in the decomposition of the incrementer portion may not be able to be performed in parallel with those in the decomposition of the multiplier portion (e.g., because the decomposition of the multiplier portion may be in the form of a balanced tree of addition operations). In such cases, the method may include combining the various addition operations of the decompositions regardless so as to take advantage of common glue logic or other common logic resources and/or other types of reduced PLD component usage separate from that related to arranging addition operations in parallel. Alternatively, in such cases, the method may include decomposing the incrementer-multiplier operation using other types of arithmetic and/or logical decompositions.

When the multiplier operand bit-width is not a power of two, however, the number or stages (e.g., also referred to as "levels" where the output of one operation is fed into the input of another operation to produce a result) of addition operations used to implement the corresponding merged incrementer-multiplier operation will typically be less than the number or stages of operations used in conventional decompositions. For example, such merged operations may make use of one or more shift operations, as described herein, which may be implemented to be performed substantially in parallel with linked addition operations. Furthermore, increasing the number of bits or digits shifted does not by itself increase the number of stages or the time delays associated with the shift operation. Once a particular decomposition for a merged operation is determined and/or selected, that decomposition may be used to synthesize and/or map the merged incrementer-multiplier operation into a corresponding reduced number of PLD components and/or an arrangement of PLD components with a reduced propagation delay.

As a result of such process (e.g., optimization), a incrementer-multiplier operation without a power of two multiplier operand bit-width may be implemented efficiently using one or more shift operations and/or addition operations, thereby freeing up the configurable PLD components that would otherwise be occupied by additional arithmetic and/or logical operations. Furthermore, because the number of stages of operations used in the merged operation will be reduced, the propagation delay of the incrementer-multiplier operation will also be reduced, which in some cases may advantageously permit an increase in the clock frequency of a PLD configured with the user design.

In some embodiments, the converted user design and/or the optimized user design may be represented by a netlist that identifies various types of components provided by the PLD and their associated signals. In embodiments that produce a netlist of the converted user design, the optimization process may be performed on such a netlist.

As noted above, the methodologies disclosed herein may be better understood with specific reference to implementation and configuration techniques for PLDs, such as PLD 100, programmable logic blocks 104, and logic cells 200 of FIGS. 1 and 2, and process 300 of FIG. 3. Referring now to FIG. 1, FIG. 1 illustrates a block diagram of a PLD 100 in accordance with an embodiment of the disclosure. PLD 100 (e.g., a field programmable gate array (FPGA)), a complex programmable logic device (CPLD), a field programmable system on a chip (FPSC), or other type of programmable device) generally includes input/output (I/O) blocks 102 and logic blocks 104 (e.g., also referred to as programmable logic blocks (PLBs), programmable functional units (PFUs), or programmable logic cells (PLCs)).

I/O blocks 102 provide I/O functionality (e.g., to support one or more I/O and/or memory interface standards) for PLD 100, while programmable logic blocks 104 provide logic functionality (e.g., LUT-based logic or logic gate array-based logic) for PLD 100. Additional I/O functionality may be provided by serializer/deserializer (SERDES) blocks 150 and physical coding sublayer (PCS) blocks 152. PLD 100 may also include hard intellectual property core (IP) blocks 160 to provide additional functionality (e.g., substantially predetermined functionality provided in hardware which may be configured with less programming than logic blocks 104).

PLD 100 may also include blocks of memory 106 (e.g., blocks of EEPROM, block SRAM, and/or flash memory), clock-related circuitry 108 (e.g., clock sources, PLL circuits, and/or DLL circuits), and/or various routing resources 180 (e.g., interconnect and appropriate switching logic to provide paths for routing signals throughout PLD 100, such as for clock signals, data signals, or others) as appropriate. In general, the various elements of PLD 100 may be used to perform their intended functions for desired applications, as would be understood by one skilled in the art.

For example, certain. I/O blocks 102 may be used for programming memory 106 or transferring information (e.g., various types of user data and/or control signals) to/from PED 100. Other I/O blocks 102 include a first programming port (which may represent a central processing unit (CPU) port, a peripheral data port, an SPI interface, and/or a sysCONFIG programming port) and/or a second programming port such as a joint test action group (JTAG) port (e.g., by employing standards such as Institute of Electrical and Electronics Engineers (IEEE) 1149.1 or 1532 standards). In various embodiments, I/O blocks 102 may be included to receive configuration data and commands (e.g., over one or more connections 140) to configure PLD 100 for its intended use and to support serial or parallel device configuration and information transfer with SERDES blocks 150, PCS blocks 152, hard IP blocks 160, and/or logic blocks 104 as appropriate.

It should be understood that the number and placement of the various elements are not limiting and may depend upon the desired application. For example, various elements may not be required for a desired application or design specification (e.g., for the type of programmable device selected).

Furthermore, it should be understood that the elements are illustrated in block form for clarity and that various elements would typically be distributed throughout PLD 100, such as in and between logic blocks 104, hard IP blocks 160, and routing resources 180 to perform their conventional functions (e.g., storing configuration data that configures PLD 100 or providing interconnect structure within PLD 100). It should also be understood that the various embodiments disclosed herein are not limited to programmable logic devices, such as PLD 100, and may be applied to various other types of programmable devices, as would be understood by one skilled in the art.

An external system 130 may be used to create a desired user configuration or design of PLD 100 and generate corresponding configuration data to program (e.g., configure) PLD 100. For example, system 130 may provide such configuration data to one or more I/O blocks 102, SERDES blocks 150, and/or other portions of PLD 100. As a result, programmable logic blocks 104, routing resources 180, and any other appropriate components of PLD 100 may be configured to operate in accordance with user-specified applications.

In the illustrated embodiment, system 130 is implemented as a computer system. In this regard, system 130 includes, for example, one or more processors 132 which may be configured to execute instructions, such as software instructions, provided in one or more memories 134 and/or stored in non-transitory form in one or more non-transitory machine readable mediums 136 (e.g., which may be internal or external to system 130). For example, in some embodiments, system 130 may run PLD configuration software, such as Lattice Diamond System Planner software available from Lattice Semiconductor Corporation to permit a user to create a desired configuration and generate corresponding configuration data to program PLD 100.

System 130 also includes, for example, a user interface 135 (e.g., a screen or display) to display information to a user, and one or more user input devices 137 (e.g., a keyboard, mouse, trackball, touchscreen, and/or other device) to receive user commands or design entry to prepare a desired configuration of PLD 100.

FIG. 2 illustrates a block diagram of a logic block 104 of PLD 100 in accordance with an embodiment of the disclosure. As discussed, PLD 100 includes a plurality of logic blocks 104 including various components to provide logic and arithmetic functionality.

In the example embodiment shown in FIG. 2, logic block 104 includes a plurality of logic cells 200. For example, each logic cell 200 may include various components such as: a lookup table (LUT) 202, a carry logic circuit 204, a latch 206 (e.g., register), and programmable multiplexers 208, 212, 214, and 216 for selecting desired signal paths for logic cell 200. In this example, LUT 202 accepts four inputs 220A-220D, which makes it a four-input LUT (which may be abbreviated as "4-LUT" or "LUT4") that can be programmed by configuration data for PLD 100 to implement any appropriate logic operation having four inputs or less. LUT 202 in other examples may be of any other suitable size having any other suitable number of inputs for a particular implementation of a PLD. In some embodiments, different size LUTs may be provided for different logic blocks 104 and/or different logic cells 200.

An output signal 222 from LUT 202 may be passed through multiplexer 216 or register 206 to provide an output signal 233 of logic cell 200. Depending on the configuration of multiplexers 210-216, output signal 222 may be temporarily stored (e.g., latched) in latch 206 according to control signals 230. In some embodiments, configuration data for PLD 100 may configure output 233 of logic cell 200 to be provided as one or more inputs of another logic cell 200 (e.g., in another logic block or the same logic block) in a staged or cascaded arrangement (e.g., comprising multiple levels) to configure logic operations that cannot be implemented in a single logic cell 200 (e.g., logic operations that have too many inputs to be implemented by a single LUT 202).

Carry logic circuit 204 may be utilized for some configurations of PLD 100 to efficiently implement arithmetic operations such as adders, subtractors, comparators, counters, or other operations, or to efficiently form some wide logic operations (e.g., working on multiple bit data). In this regard, carry logic circuits 204 across multiple logic cells 202 may be chained together to pass carry-in signals 205 and carry-out signals 207 between adjacent logic cells 202. In the example of FIG. 2, carry-in signal 205 may be passed to carry logic circuit 204 by configuring programmable multiplexer 208. In some embodiments, carry logic circuits 204 may be chained across multiple logic blocks 200. Carry logic circuit 204 may be implemented to provide a carry value for arithmetic operations or logic operations. For example, in one embodiment, carry logic circuit 204 may be implemented using a carry-multiplexer (also referred to as a "carry-mux").

Logic cell 200 illustrated in FIG. 2 is merely an example, and logic cells 200 according to different embodiments may include different combinations of PLD components. Also, although FIG. 2 illustrates logic block 104 having eight logic cells 200, logic block 104 according to other embodiments may include fewer logic cells 200 or more logic cells 200. Each of the logic cells 200 of logic block 104 may be used to implement a portion of a user design implemented by PLD 100. In this regard, PLD 100 may include many logic blocks 104, each of which may include logic cells 200 and/or other components which are used to collectively implement the user design.

As further described herein, portions of a user design may be adjusted to occupy fewer logic cells 200 and/or fewer logic blocks 104 when PLD 100 is configured to implement the user design. Such adjustments according to various embodiments may identify certain arithmetic or logic operations, such as incrementer-multiplier operation, to be implemented in an arrangement occupying multiple embodiments of logic cells 200 and/or logic blocks 104. As further described herein, an optimization process may rearrange various signal connections associated with the arithmetic/logic operations described herein, such that an incrementer-multiplier operation may be implemented into logic cells 200 and/or logic blocks 104 to be associated with the preceding arithmetic/logic operations.

FIG. 3 illustrates a design process 300 for a PLD in accordance with an embodiment of the disclosure. For example, the process of FIG. 3 may be performed by system 130 running Lattice Diamond software to configure PLD 100. In some embodiments, the various files and information referenced in FIG. 3 may be stored, for example, in one or more databases and/or other data structures in memory 134, machine readable medium 136, and/or otherwise.

In operation 310, system 130 receives a user design that specifies the desired functionality of PLD 100. For example, the user may interact with system 130 (e.g., through user input device 137 and hardware description language (HDL) code representing the design) to identify various features of the user design (e.g., high level logic operations, hardware configurations, and/or other features). In some embodiments, the user design may be provided in a register transfer level (RTL) description (e.g., a gate level description). System 130 may perform one or more rule checks to confirm that the user design describes a valid configuration of PLD 100. For example, system 130 may reject invalid configurations and/or request the user to provide new design information as appropriate.

In operation 320, system 130 synthesizes the design to create a netlist (e.g., a synthesized RTL description) identifying an abstract logic implementation of the user design as a plurality of logic components (e.g., also referred to as netlist components). In some embodiments, the netlist may be stored in Electronic Design Interchange Format (EDIF) in a Native Generic Database (NGD) file.

In some embodiments, synthesizing the design into a netlist in operation 320 may involve converting (e.g., translating) the high-level description of logic operations, hardware configurations, and/or other features in the user design into a set of PLD components (e.g., logic blocks 104, logic cells 200, and other components of PLD 100 configured for logic, arithmetic, or other hardware functions to implement the user design) and their associated interconnections or signals. Depending on embodiments, the converted user design may be represented as a netlist.

In some embodiments, synthesizing the design into a netlist in operation 320 may further involve performing an optimization process on the user design (e.g., the user design converted/translated into a set of PLD components and their associated interconnections or signals) to reduce propagation delays, consumption of PLD resources and interconnections, and/or otherwise optimize the performance of the PLD when configured to implement the user design. Depending on embodiments, the optimization process may be performed on a netlist representing the converted/translated user design. Depending on embodiments, the optimization process may represent the optimized user design in a netlist (e.g., to produce an optimized netlist).

In some embodiments, the optimization process may include optimizing certain instances of an incrementer-multiplier operation which, when a PLD is configured to implement the user design, would occupy a plurality of configurable PLD components (e.g., logic cells 200 and/or logic blocks 104). For example, as further described herein, the optimization process may include detecting incrementer-multiplier operations in the user design and merging incrementer and multiplier portions of the identified incrementer-multiplier operations to reduce the number of PLD components used to implement the incrementer-multiplier operations and/or to reduce the propagation delay associated with the incrementer-multiplier operations.

In operation 330, system 130 performs a mapping process that identifies components of PLD 100 that may be used to implement the user design. In this regard, system 130 may map the optimized netlist (e.g., stored in operation 320 as a result of the optimization process) to various types of components provided by PLD 100 (e.g., logic blocks 104, logic cells 200, embedded hardware, and/or other portions of PLD 100) and their associated signals (e.g., in a logical fashion, but without yet specifying placement or routing). In some embodiments, the mapping may be performed on one or more previously-stored NGD files, with the mapping results stored as a physical design file (e.g., also referred to as an NCD file). In some embodiments, the mapping process may be performed as part of the synthesis process in operation 320 to produce a netlist that is mapped to PLD components.

In operation 340, system 130 performs a placement process to assign the mapped netlist components to particular physical components residing at specific physical locations of the PLD 100 (e.g., assigned to particular logic cells 200, logic blocks 104 and/or other physical components of PLD 100), and thus determine a layout for the PLD 100. In some embodiments, the placement may be performed on one or more previously-stored NCD files, with the placement results stored as another physical design file.

In operation 350, system 130 performs a routing process to route connections (e.g., using routing resources 180) among the components of PLD 100 based on the placement layout determined in operation 340 to realize the physical interconnections among the placed components. In some embodiments, the routing may be performed on one or more previously-stored NCD files, with the routing results stored as another physical design file.

Thus, following operation 350, one or more physical design files may be provided which specify the user design after it has been synthesized (e.g., converted and optimized), mapped, placed, and routed for PLD 100 (e.g., by combining the results of the corresponding previous operations). In operation 360, system 130 generates configuration data for the synthesized, mapped, placed, and routed user design. In operation 370, system 130 configures PLD 100 with the configuration data by, for example, loading a configuration data bitstream into PLD 100 over connection 140.

Figure 4:
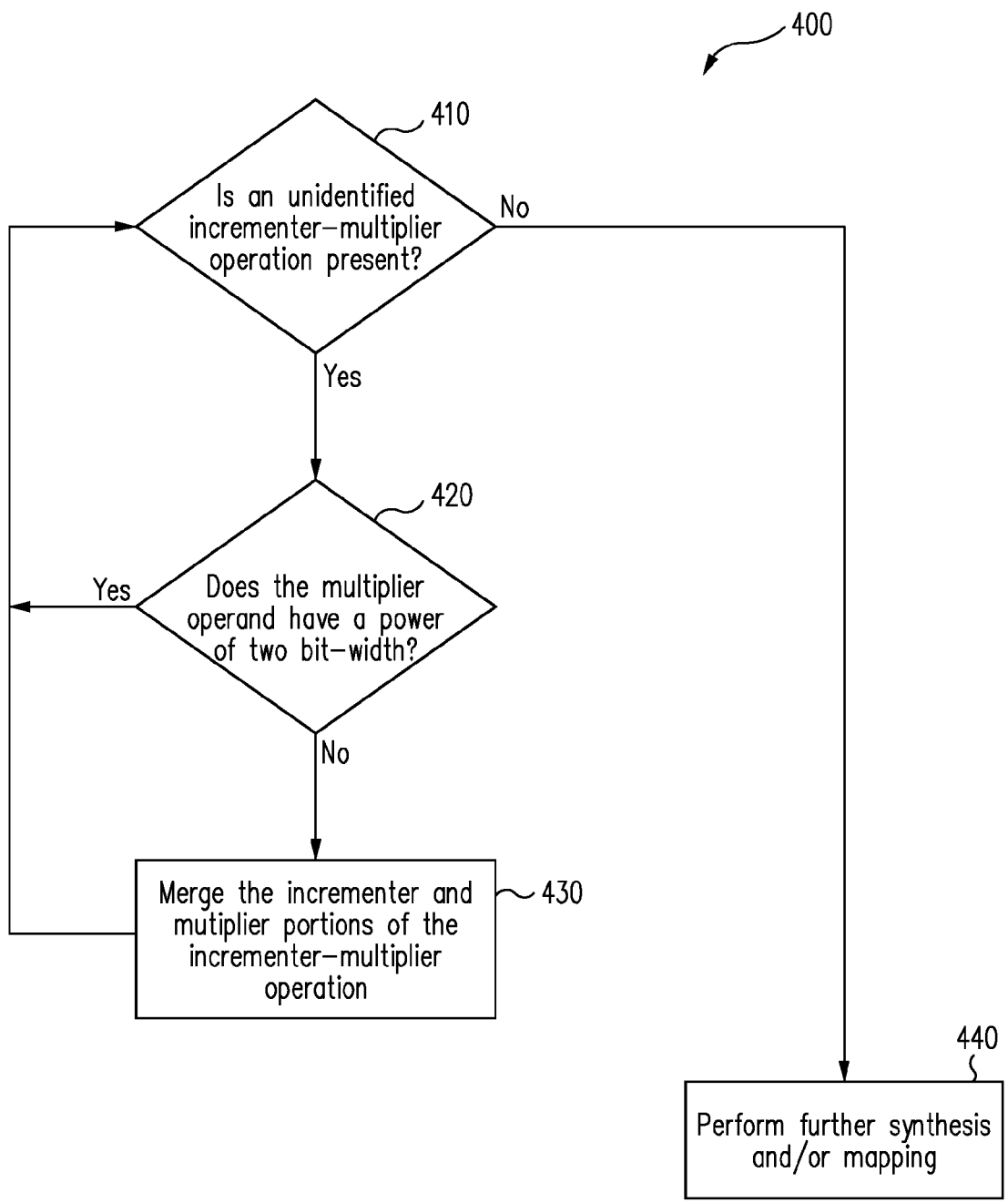
FIG. 4 illustrates an incrementer-multiplier operation synthesis and/or mapping process for a user design and/or PLD in accordance with an embodiment of the disclosure.

FIG. 4 illustrates an incrementer-multiplier operation synthesis and/or mapping process 400 (e.g., also referred to as an optimization process) for a user design and/or PLD, in accordance with an embodiment of the disclosure. In some embodiments, process 400 may be performed during operation 320 of process 300 as discussed above. In other embodiments, process 400 may be performed after generation of a preliminary netlist and/or mapping generated by a preliminary execution of operations 320 and/or 330 of process 300, for example, and may be adapted to be performed on such preliminary netlist and/or mapping specified user design (e.g., using EDIF and/or NGD) rather than or in addition to being performed on an HDL or RTL specified user design. Process 400 may be executed by system 130 to optimize certain instances of incrementer-multiplier operations as discussed above. In particular, one or more embodiments of process 400 may optimize the user design for a PLD with logic blocks or logic cells that comprise four-input LUTs, such as the example of logic block 104 and logic cell 200 having LUT 202 shown in FIG. 2. For example, a single four-input LUT may be configured to implement one bit of a multi-bit addition or subtraction operation.

In various embodiments, process 400 may identify, from the user design, certain instances of incrementer-multiplier operations that can be optimized through systematic decomposition and merging of the incrementer and multiplier portions of the operation, as described herein. FIGS. 7 and 8 illustrate two implementations 700 and 800 of an incrementer-multiplier operation roughly corresponding to graphs 500 and 600 of FIGS. 5 and 6, respectively (e.g., the conceptually described incrementer-multiplier operations illustrated in FIGS. 5 and 6 accept four-bit inputs 502 and 504, whereas the incrementer-multiplier operation implementations illustrated in FIGS. 7 and 8 accept five-bit inputs 702 and 704). In particular, implementations 700 and 800 accept the same incrementer operand 702 and multiplier operand 704, and both output product 750, but implementation 800 includes one less stage in its critical timing path and reduces overall use of various logic resources, such as various types of interface or glue logic, including latches, registers, stored states, synchronous or asynchronous logic operations, clocked logic operations, and/or various AND, OR, INV, and/or other types of logic operations.

More specifically, incrementer-multiplier operation 700 includes incrementer portion 710 (e.g., substantially a unit addition operation) providing a multiplicant operand to multiplier portion 720, which multiplies the multiplicant operand by multiplier operand 704 and produces product 750 as output. As shown in FIG. 7, multiplier portion 720 includes glue logic 722, which may comprise various interface and/or other logic resources, including latches, registers, stored states, synchronous or asynchronous logic operations, clocked logic operations, various AND, OR, INV, and/or other types of logic operations, for example, that are configured to accept inputs and convey them to operations implemented within multiplier portion 720. In the embodiment shown in FIG. 7, glue logic 722 accepts input from incrementer portion 710 and multiplier operand 704 and conveys those inputs to the various inputs of addition operations 740-746 (e.g., inputs A, B, and CIN of addition operations 740-746).

In some embodiments, glue logic 722 may be configured to operate on the inputs before providing them to addition operations 740-746. For example, in the context of binary arithmetic, glue logic 722 may be configured to convert the multiplicant operand provided by incrementer portion 710 and multiplier operand 704 into appropriate partial products 726 (e.g., also shown in FIG. 7 as mr1, mr2, mr3, mr4, and mr5, corresponding to partial products 526 of FIG. 5) using null paddings 728 (e.g., also shown in FIG. 7 as various zeros provided to inputs of addition operations 740-746). As such, glue logic 722 may be configured to implement one or more shift operations and/or null padding operations. Furthermore, glue logic 722 may be configured to implement various multiplication operations that may in turn be used to determine the values of partial products 726. In other embodiments, glue logic 722 may be configured to convey or route inputs to addition operations 740-746, for example, and such shift, padding, and/or multiplication operations may be embedded within addition operations 740-746.

In various embodiments, glue logic 722 may also be configured to set carry-in inputs 724 to constant values (e.g., shown in FIG. 7 as zeros provided to CIN inputs of addition operations 740-746) and/or route carry-in inputs 724 as appropriate among addition operations 740-746 (e.g., similar to the carry logic described herein). Furthermore, glue logic 722 may also be configured to convey or route outputs of addition operations 740-746 (e.g., shown as outputs "O" of addition operations 740-746) as appropriate among addition operations 740-746 and/or to output product 750. Although not explicitly shown in FIG. 7, incrementer portion 710 includes its own glue logic configured to perform similar operations within incrementer portion 710. Thus, implementation 700 includes four stages of five different addition operations in its critical timing path (incrementer 710, addition operations 740 or 742, addition operation 744, and addition operation 746) and various logic resources implementing glue logic 722 of multiplier portion 720 and separate glue logic within incrementer portion 710.

As shown in FIG. 8, implementation 800 accepts the same incrementer operand 702 and multiplier operand 704, outputs the same product 750, and includes the same total number of addition operations (e.g., five) as implementation 700. However, implementation 800, which conceptually merges implementer portion 710 and multiplier portion 720 into merged incrementer-multiplier operation 830, includes only three stages in its critical timing path (addition operations 740 or 742, addition operations 744 or 848, and addition operation 746) and eliminates various logic resources (e.g., glue logic and/or other logic resources) associated with incrementer operation 710.

Furthermore, in some embodiments, the additional addition operation 848 in merged incrementer-multiplier operation 830 may be implemented with fewer PLD resources than the addition operation within incrementer portion 710 of FIG. 7 due to the expected inputs of addition operation 848. For example, in some embodiments, each single bit addition operation of each addition operation may be implemented with a single four-input LUT, and each multi-bit addition operation (e.g., each addition operation 740-746 and 848) may be implemented with multiple four-input LUTs arranged in various stages or levels. In some embodiments, addition operation 848 may be implemented with a fewer total number of LUTs and/or stages of LUTs as compared to those used to implement incrementer portion 710 of FIG. 7.

In the embodiment shown in FIG. 8, merged incrementer-multiplier operation 830 is configured to implement the incrementer-multiplier operation illustrated by mathematical graph 600 of FIG. 6. As shown, merged incrementer-multiplier operation 830 includes common glue logic 832, which may comprise various interface and/or other logic resources, including latches, registers, stored states, synchronous or asynchronous logic operations, clocked logic operations, various AND, OR, INV, and/or other types of logic operations, for example, that are configured to accept input from incrementer operand 702 and multiplier operand 704 and convey those inputs to the various inputs of addition operations 740-746 and 848 (e.g., inputs A, B, and CIN of addition operations 740-746 and 848).

In some embodiments, common glue logic 832 may be configured to operate on the inputs before providing them to addition operations 740-746 and 848. For example, in the context of binary arithmetic, common glue logic 832 may be configured to convert incrementer operand 702 and multiplier operand 704 into appropriate partial products 836 (e.g., also shown in FIG. 8 as mr1, mr2, mr3, mr4, and mr5, corresponding to partial products 636 of FIG. 6) using unit paddings 838 (e.g., also shown in FIG. 8 as various "ones" provided to inputs of addition operations 740-746 and 848). As such, common glue logic 832 may be configured to implement one or more shift operations and/or unit padding operations. Furthermore, common glue logic 832 may be configured to implement various multiplication operations (e.g., a single bit multiplication operation or "enable" operation) that may in turn be used to determine the values of partial products 836. In other embodiments, common glue logic 832 may be configured to convey or route inputs to addition operations 740-746 and 848, for example, and such shift, padding, and/or multiplication operations may be embedded within addition operations 740-746 and 848.

In various embodiments, common glue logic 832 may also be configured to set carry-in inputs 834 to constant values (e.g., shown in FIG. 8 as a zero provided to a CIN input of addition operation 848) or to appropriate values of multiplier operand 704 (e.g., shown in FIG. 8 as elements B[0], B[1], B[2], and B[3] provided to CIN inputs of addition operations 740-746), and/or to route carry-in inputs 834 as appropriate among addition operations 740-746 and 848 (e.g., similar to the carry logic described herein). In some embodiments, common glue logic 832 may be configured to route one or more elements of multiplier operand 704 directly to an input of an addition operation (e.g., element B[4] routed to input A of addition operation 848). Furthermore, common glue logic 832 may also be configured to convey or route outputs of addition operations 740-746 and 848 (e.g., shown as outputs "O" of addition operations 740-746 and 848) as appropriate among addition operations 740-746 and 848 and/or to output product 750. Thus, implementation 800 includes three stages of five different addition operations in its critical timing path (addition operations 740 or 742, addition operations 744 or 848, and addition operation 746) and various logic resources implementing common glue logic 832. Therefore, implementation 800 may exhibit a timing performance improvement of approximately 25% in addition to any area savings associated with the use of common glue logic 832 as opposed to glue logic 722 and other glue logic associated with incrementer portion 710 of implementation 700.

In some embodiments, implementation 800 may be configured to leverage general-use addition operation implementations that can be interchangeably used in implementation 700 and implementation 800 (e.g., without a specific design change to the addition operations that might otherwise require additional PLD resources. In other embodiments, one or more addition operations within merged incrementer-multiplier operation 830 of implementation 800 may be specifically adapted to implement aspects of implementation 800 in a way that differentiates those addition operations from general-use addition operation implementations. For example, in some embodiments, one or more addition operations within merged incrementer-multiplier operation 830 may include one or more embedded shift and/or unit padding operations otherwise atypical of a general-use addition operation implementation for a PLD.

As further described herein, process 400 may advantageously merge incrementer and multiplier portions of incrementer-multiplier operations detected in a user design (e.g., corresponding to incrementer portion 710 and multiplier 720 of FIG. 7) to form merged incrementer-multiplier operations (e.g., corresponding to merged incrementer-multiplier operation 800 of FIG. 8), thereby reducing the number of PLD resources that would otherwise be consumed to implement, for example, implementation 700.

Referring again to FIG. 4, in operation 410, system 130 determines whether an unidentified incrementer-multiplier operation is present in the user design. If so, process 400 tags the unidentified incrementer-multiplier operation as identified and continues to operation 420 to check if a multiplier operand bit-width of the identified incrementer-multiplier operation is a power of two. If not, process 400 continues to operation 440 to perform further synthesis, mapping, and/or other optimizations if desired or available with respect to the user design.

In operation 420, system 130 determines whether a multiplier operand bit-width of the incrementer-multiplier operation identified in operation 410 is a power of two. If not, process 400 continues to operation 430 to merge the incrementer and multiplier portions of the identified operation to form a merged incrementer-multiplier operation, as described herein, after which process 400 may loop back to operation 410. Otherwise, process 400 loops back to operation 410, as shown.

In some embodiments, operations 410 and 420 may be performed in any appropriate order to identify suitable instances in the user design to optimize. For example, in some cases, it may be more efficient to identify all incrementer-multiplier operations present in the user design before moving to operation 420. In such cases, system 130 may first determine whether the same multiplier operand bit-width is used in multiple incrementer-multiplier operations to minimize the number of times operations 420 and/or 430 are performed (e.g., once per unique multiplier operand bit-width).

Once a suitable instance of an incrementer-multiplier operation with a corresponding non-power of two multiplier operand bit-width is determined to be present and identified through operations 410-420, an optimization may be performed on the identified instance by merging the incrementer and multiplier portions of the identified operation, in operation 430, as described herein.

For example, in one embodiment, the multiplier portion of the incrementer-multiplier operation may be decomposed into one or more addition operations. In such embodiments, the incrementer portion of the incrementer-multiplier operation may be merged with the decomposed multiplier portion. In various embodiments, the merged portions may be configured to use, at least in part, common glue logic, such as common glue logic 832 of FIG. 8, and/or the merged incrementer-multiplier operation may include at least two addition operations configured to operate substantially in parallel (e.g., addition operation 848 and any one of addition operations 740-744 of FIG. 8). In some embodiments, the merged incrementer-multiplier operation may include three, four, or many multiple addition operations configured to operate substantially in parallel, including one or more single bit addition operations.

After optimizing a suitable instances of a incrementer-multiplier operation in operation 430, process 400 may loop through operations 410-430 until all such incrementer-multiplier operations in the user design are similarly optimized or at least identified, and then continue (e.g., through the "no" option of operation 410) to operation 440 to perform further synthesis, mapping, and/or other optimizations if desired or available with respect to the user design. For example, in one embodiment, incrementer-multiplier operations with a multiplier operand bit-width that is a power of two may be decomposed and/or merged using processes similar to those disclosed herein (e.g., without the benefits resulting solely from a reduction in the number of stages in their critical path) and/or other arithmetic and/or logical decompositions in order to be implemented in a PLD.

Therefore, in view of the present disclosure, it will be appreciated that the optimization techniques described herein may be used to identify and optimize various instances of incrementer-multiplier operations. Without applying the optimization techniques of the present disclosure, such instances in the user design would unnecessarily occupy multiple configurable PLD components and/or levels of configurable PLD components when a PLD is configured to implement the user design. As discussed above, the optimization techniques may merge incrementer and multiplier portions of incrementer-multiplier operations to form merged incrementer-multiplier operations, such that resulting synthesis and/or mapping can reduce the levels of configurable PLD components used to implement the user design. Such an optimization may beneficially reduce consumption of configurable PLD resources, and in some cases may permit an increase in the clock frequency of a PLD configured with the user design for an increase computational performance. In general statistical analysis of a typical user design comprising a variety of arithmetic and logical operations, the timing performance has been improved between approximately 5% and 28%, and utilization of PLD components has been reduced. Typically, such benefits increase with increasing incrementer operand and/or the multiplier operand bit-widths.

Where applicable, various embodiments provided by the present disclosure can be implemented using hardware, software, or combinations of hardware and software. Also where applicable, the various hardware components and/or software components set forth herein can be combined into composite components comprising software, hardware, and/or both without departing from the spirit of the present disclosure. Where applicable, the various hardware components and/or software components set forth herein can be separated into sub-components comprising software, hardware, or both without departing from the spirit of the present disclosure. In addition, where applicable, it is contemplated that software components can be implemented as hardware components, and vice-versa.

Software in accordance with the present disclosure, such as program code and/or data, can be stored on one or more non-transitory machine readable mediums. It is also contemplated that software identified herein can be implemented using one or more general purpose or specific purpose computers and/or computer systems, networked and/or otherwise. Where applicable, the ordering of various steps described herein can be changed, combined into composite steps, and/or separated into sub-steps to provide features described herein.

Embodiments described above illustrate but do not limit the invention. It should also be understood that numerous modifications and variations are possible in accordance with the principles of the present invention. Accordingly, the scope of the invention is defined only by the following claims.

We claim:

1. A computer-implemented method comprising:
    receiving a design identifying operations to be performed by a programmable logic device (PLD); and
    synthesizing the design into a plurality of PLD components, wherein the synthesizing comprises:
        detecting an incrementer-multiplier operation in the design, and
        merging an incrementer portion of the incrementer-multiplier operation with a multiplier portion of the incrementer-multiplier operation to reduce the plurality of PLD components, wherein the merged incrementer-multiplier operation comprises at least two addition operations configured to operate substantially in parallel.

2. The computer-implemented method of claim 1, wherein the synthesizing comprises:
    decomposing the multiplier portion of the incrementer-multiplier operation into one or more of the addition operations; and
    the merging comprises merging the incrementer portion with the decomposed multiplier portion, wherein the merged portions are configured to use common glue logic.

3. The computer-implemented method of claim 2, wherein:
    each addition operation comprises a carry-in input; and
    the common glue logic is configured to provide an element of a multiplier operand of the incrementer-multiplier operation to one of the carry-in inputs.

4. The computer-implemented method of claim 2, wherein:
    each addition operation comprises an operand input;
    the common glue logic is configured to provide a partial product to the operand input; and
    at least one of the addition operations is configured to shift the partial product with unit paddings.

5. The computer-implemented method of claim 2, wherein:
    each addition operation comprises an operand input; and
    the common glue logic is configured to provide a shifted partial product with unit paddings to the operand input.

6. The computer-implemented method of claim 1, wherein the incrementer-multiplier operation comprises a first incrementer-multiplier operation, and wherein the synthesizing comprises:
    determining the first incrementer-multiplier operation has a multiplier operand bit-width that is a power of two;
    detecting a second incrementer-multiplier operation in the design; and
    merging an incrementer portion of the second incrementer-multiplier operation with a multiplier portion of the second incrementer-multiplier operation to reduce the plurality of PLD components.

7. The computer-implemented method of claim 1, wherein:
    the addition operations are implemented by at least one look up table (LUT); and
    the at least one LUT is implemented within a programmable logic block of the PLD.

8. The computer-implemented method of claim 7, wherein:
    the programmable logic block comprises a plurality of logic cells; and
    each one of the at least one LUT is associated with a corresponding one of the logic cells.

9. The computer-implemented method of claim 7, wherein:
    each one of the at least one LUT is a four-input LUT; and
    the four-input LUT is configured to implement a one bit addition operation.

10. The computer-implemented method of claim 1, further comprising:
generating configuration data to configure physical components of the PLD in accordance with the synthesized design; and
programming the PLD with the configuration data.

11. A system comprising:
a processor; and
a memory adapted to store a plurality of computer readable instructions which when executed by the processor are adapted to cause the system to perform a computer-implemented method comprising:
receiving a design identifying operations to be performed by a programmable logic device (PLD),
synthesizing the design into a plurality of PLD components, wherein the synthesizing comprises:
detecting an incrementer-multiplier operation in the design, and
merging an incrementer portion of the incrementer-multiplier operation with a multiplier portion of the incrementer-multiplier operation to reduce the plurality of PLD components.

12. The system of claim 11, wherein the synthesizing comprises:
decomposing the multiplier portion of the incrementer-multiplier operation into one or more addition operations; and
merging the incrementer portion with the decomposed multiplier portion, wherein the merged portions are configured to use common glue logic.

13. The system of claim 12, wherein:
each addition operation comprises a carry-in input; and
the common glue logic is configured to provide an element of a multiplier operand of the incrementer-multiplier operation to one of the carry-in inputs.

14. The system of claim 12, wherein:
each addition operation comprises an operand input;
the common glue logic is configured to provide a partial product to the operand input; and
at least one of the addition operations is configured to shift the partial product with unit paddings.

15. The system of claim 12, wherein:
each addition operation comprises an operand input; and
the common glue logic is configured to provide a shifted partial product with unit paddings to the operand input.

16. The system of claim 11, wherein the incrementer-multiplier operation comprises a first incrementer-multiplier operation, and wherein the synthesizing comprises:
determining the first incrementer-multiplier operation has a multiplier operand bit-width that is a power of two;
detecting a second incrementer-multiplier operation in the design; and
merging an incrementer portion of the second incrementer-multiplier operation with a multiplier portion of the second incrementer-multiplier operation to reduce the plurality of PLD components.

17. The system of claim 11, wherein:
the merged incrementer-multiplier operation comprises at least two addition operations configured to operate substantially in parallel;
the addition operations are implemented by at least one look up table (LUT); and
the at least one LUT is implemented within a programmable logic block of the PLD.

18. The system of claim 17, wherein:
the PLB comprises a plurality of logic cells;
each one of the at least one LUT is a four-input LUT associated with a corresponding one of the logic cells; and
the four-input LUT is configured to implement a one bit addition operation.

19. The system of claim 11, wherein the computer-implemented method further comprises:
generating configuration data to configure physical components of the PLD in accordance with the synthesized design; and
programming the PLD with the configuration data.

20. A non-transitory machine-readable medium storing a plurality of machine-readable instructions which when executed by one or more processors of a computer system are adapted to cause the computer system to perform a computer-implemented method comprising:
receiving a design identifying operations to be performed by a programmable logic device (PLD);
synthesizing the design into a plurality of PLD components, wherein the synthesizing comprises:
detecting an incrementer-multiplier operation in the design, and
merging an incrementer portion of the incrementer-multiplier operation with a multiplier portion of the incrementer-multiplier operation to reduce the plurality of PLD components.

* * * * *